US012721184B2

(12) United States Patent
Wang et al.

(10) Patent No.: US 12,721,184 B2
(45) Date of Patent: Aug. 25, 2026

(54) METHOD FOR ALIGNING BACKSIDE PATTERN BASED ON ONE OR MORE FRONTSIDE ALIGNMENT MARKS OF A SEMICONDUCTOR WAFER

(71) Applicant: ALPHA AND OMEGA SEMICONDUCTOR INTERNATIONAL LP, Toronto (CA)

(72) Inventors: Jian Wang, Portland, OR (US); Lei Zhang, Portland, OR (US); Changqing Zhan, Vancouver, WA (US); Tai-Ming Lin, Alhambra, CA (US)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 343 days.

(21) Appl. No.: 18/592,435

(22) Filed: Feb. 29, 2024

(65) Prior Publication Data

US 2025/0279370 A1 Sep. 4, 2025

(51) Int. Cl.

| | |
|---|---|
| ***H10W 46/00*** | (2026.01) |
| ***H10D 12/00*** | (2025.01) |
| ***H10D 12/01*** | (2025.01) |
| ***H10D 30/01*** | (2025.01) |
| ***H10D 30/66*** | (2025.01) |
| ***H10D 62/10*** | (2025.01) |
| ***H10D 62/17*** | (2025.01) |
| ***H10P 30/22*** | (2026.01) |

(52) U.S. Cl.
CPC .......... *H10W 46/00* (2026.01); *H10D 12/032* (2025.01); *H10D 12/441* (2025.01); *H10D 30/0291* (2025.01); *H10D 30/66* (2025.01); *H10D 62/111* (2025.01); *H10D 62/393* (2025.01); *H10P 30/22* (2026.01); *H10W 46/301* (2026.01)

(58) Field of Classification Search
None
See application file for complete search history.

(56) References Cited

U.S. PATENT DOCUMENTS

| | | | | |
|---|---|---|---|---|
| 10,438,813 | B2 | 10/2019 | He et al. | |
| 10,833,021 | B2 | 11/2020 | Zhang et al. | |
| 2015/0236142 | A1* | 8/2015 | Laven | H10D 12/032 257/66 |
| 2016/0322472 | A1* | 11/2016 | Schloegl | H10D 12/01 |
| 2019/0006285 | A1* | 1/2019 | Zhang | H10P 72/0614 |
| 2019/0148165 | A1 | 5/2019 | He et al. | |

FOREIGN PATENT DOCUMENTS

| | | |
|---|---|---|
| JP | 2016-225583 A | 12/2016 |

* cited by examiner

*Primary Examiner* — Bradley Smith
(74) *Attorney, Agent, or Firm* — Chen-Chi Lin

(57) ABSTRACT

A method comprises the steps of providing a semiconductor wafer comprising a substrate layer; forming a first alignment mark and a second alignment mark; forming a plurality of super junction buffer regions; forming additional two or more epitaxial layers; forming additional one or more alignment marks; forming a top layer; thinning the wafer; forming a first plurality of regions and a second plurality of regions; and applying a singulation process. Devices made by the method have reduced misalignment, between a top portion and a bottom portion of an interface within the devices, for less than 0.5 micron.

12 Claims, 11 Drawing Sheets

METHOD FOR ALIGNING BACKSIDE PATTERN BASED ON ONE OR MORE FRONTSIDE ALIGNMENT MARKS OF A SEMICONDUCTOR WAFER

FIELD OF THE INVENTION

This invention relates generally to a method of fabricating semiconductor devices by precisely aligning backside pattern to frontside alignment marks of a semiconductor wafer. More particularly, the present invention relates the method referencing alignment marks distanced from a circumference of the semiconductor wafer.

BACKGROUND OF THE INVENTION

Fabrication of a semiconductor device containing a super junction metal-oxide-semiconductor field-effect transistor (SJ-MOSFET) and a reverse conducting insulated-gate bipolar transistor (RC-IGBT) requires N and P alternating patterns on a backside of a silicon wafer. The backside pattern is not precisely aligned with a frontside pattern because the silicon wafer faces down (the frontside pattern is not accessible) during a backside patterning process. A conventional fabrication method using a notch on the silicon wafer introduces large alignment errors (in the order of 30 microns) between the backside pattern and the frontside pattern.

The present disclosure references one or more frontside alignment marks distanced from a circumference of the semiconductor wafer. The alignment accuracy is improved so that the alignment error is in the order of 0.5 micron.

SUMMARY OF THE INVENTION

The present invention discloses a method for fabricating semiconductor devices. The method comprises the steps of providing a semiconductor wafer comprising a substrate layer; forming a first alignment mark and a second alignment mark; forming a plurality of super junction buffer regions; forming additional two or more epitaxial layers; forming additional one or more alignment marks; forming a top layer; thinning the wafer; forming a first plurality of regions and a second plurality of regions; and applying a singulation process.

Conventionally, MOSFET used N+ substrate and IGBT used P− substrate. In examples of present disclosure, RC-IGBT N-Substrate is used as a common substrate for the MOSFET and IGBT cells so that the SJ-MOSFET and the RC-IGBT are integrated side-by-side.

BRIEF DESCRIPTION OF THE DRAWINGS

FIG. 2A is a top view and FIGS. 2B, 2C, 2D, 2E, 2F, 2G, 2H, 21, 2J, 2K, 2L, and 2M show cross sectional views of steps of the process to fabricate the plurality of semiconductor devices of FIG. 1 in examples of the present disclosure.

DETAILED DESCRIPTION OF THE INVENTION

Figure 1:
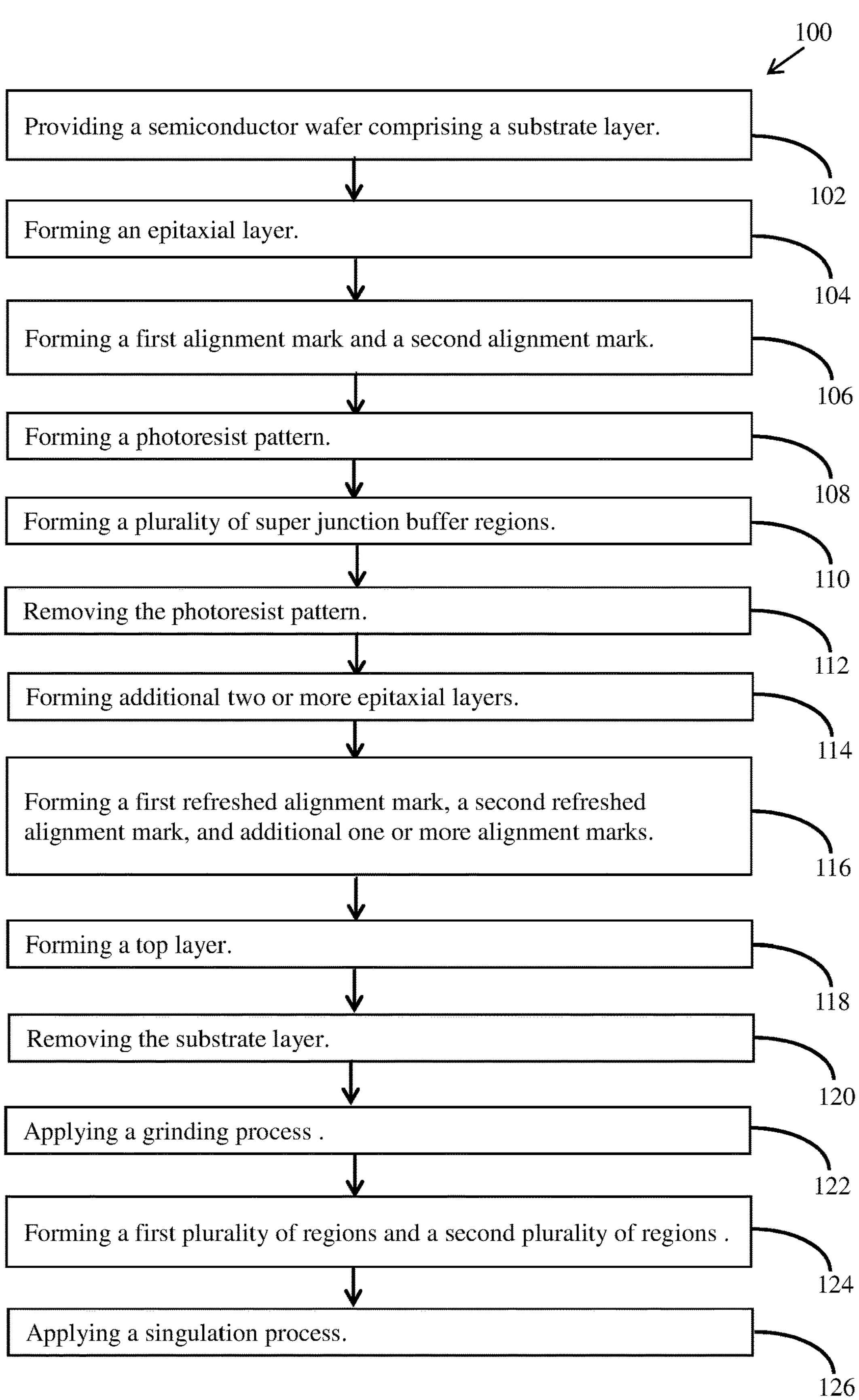
FIG. 1 is a flowchart of a process to fabricate a plurality of semiconductor devices in examples of the present disclosure.

FIG. 1 is a flowchart of a process 100 to fabricate a plurality of semiconductor devices in examples of the present disclosure. The process 100 may begin in block 102.

Figure 2A:
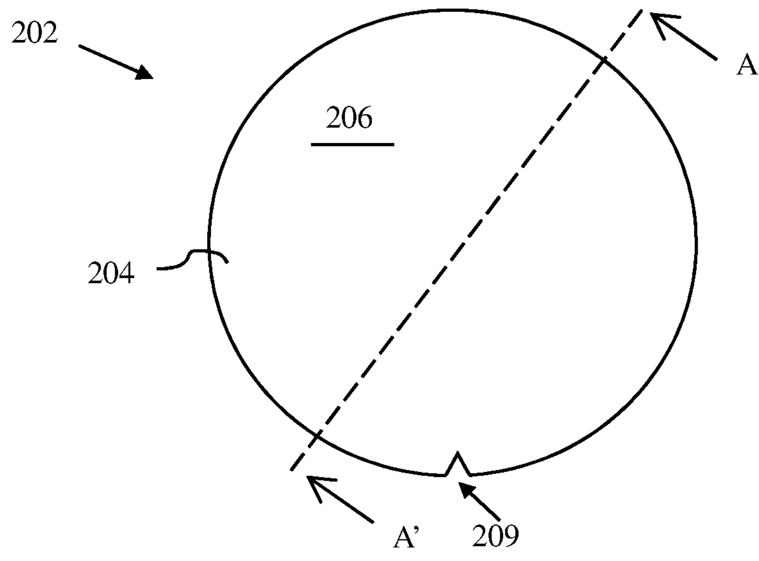
Figure 2B:
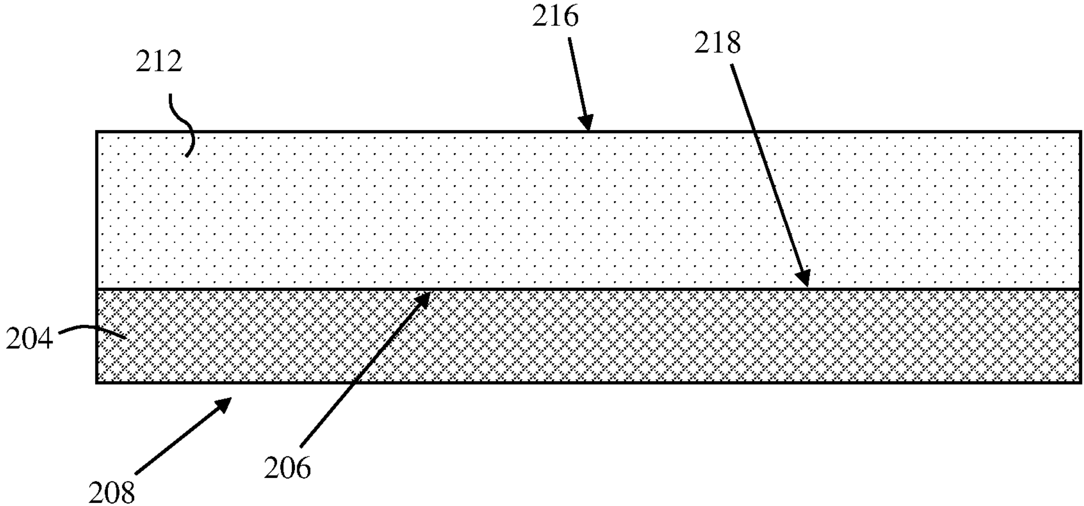

In block 102, referring now to FIGS. 2A and 2B, a semiconductor wafer 202 is provided. The semiconductor wafer 202 comprises a substrate layer 204. In one example, the substrate layer 204 is made of silicon having 8-inch diameter and 725 μm thickness. In another example, the substrate layer 204 is made of silicon having 12-inch diameter and 775 μm thickness. In examples of the present disclosure, the substrate layer 204 is a doped first conductivity type silicon substrate layer. In one example, the first conductivity type is N type. The substrate layer comprises a first side 206 and a second side 208. The second side 208 opposites the first side 206. In examples of the present disclosure, the substrate layer 204 further comprises a cutout 209. FIGS. 2B-2M are viewed toward the cross-sectional plane AA'. Block 102 may be followed by block 104.

In block 104, referring now to FIG. 2B, an epitaxial layer 212 is formed on the first side 206 of the substrate layer 204. In one example, the epitaxial layer 212 is lightly doped with N type. The epitaxial layer 212 comprises a first side 216 and a second side 218. The second side 218 opposites the first side 216. The second side 218 of the epitaxial layer 212 is attached to the first side 206 of the substrate layer 204. Block 104 may be followed by block 106.

Figure 2C:
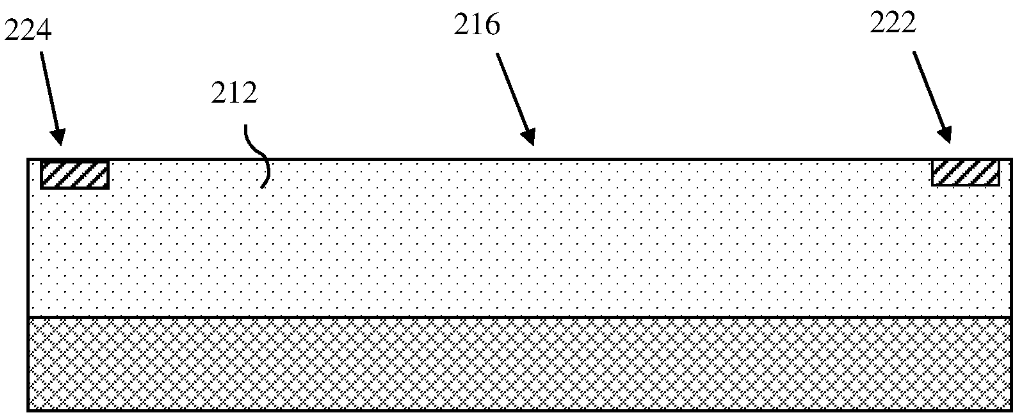
Figure 3A:
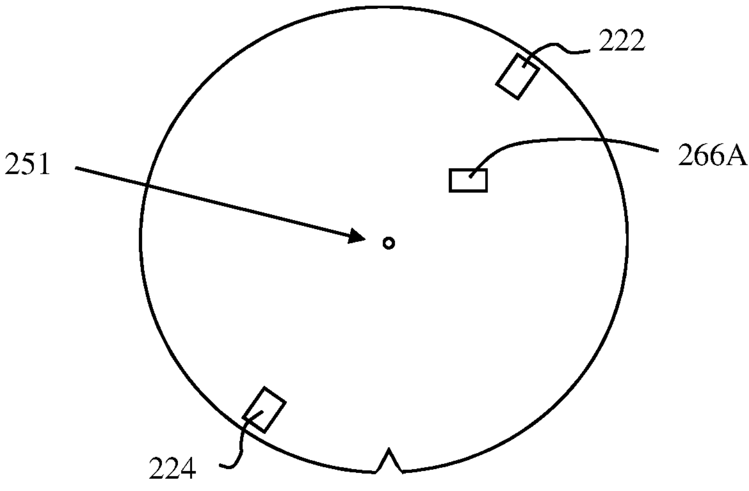
FIGS. 3A and 3B are top views of two different configurations of alignment marks in examples of the present disclosure.

In block 106, referring now to FIGS. 2C and 3A, a first alignment mark 222 and a second alignment mark 224 are formed on the first side 216 of the epitaxial layer 212. Block 106 may be followed by block 108.

Figure 2D:
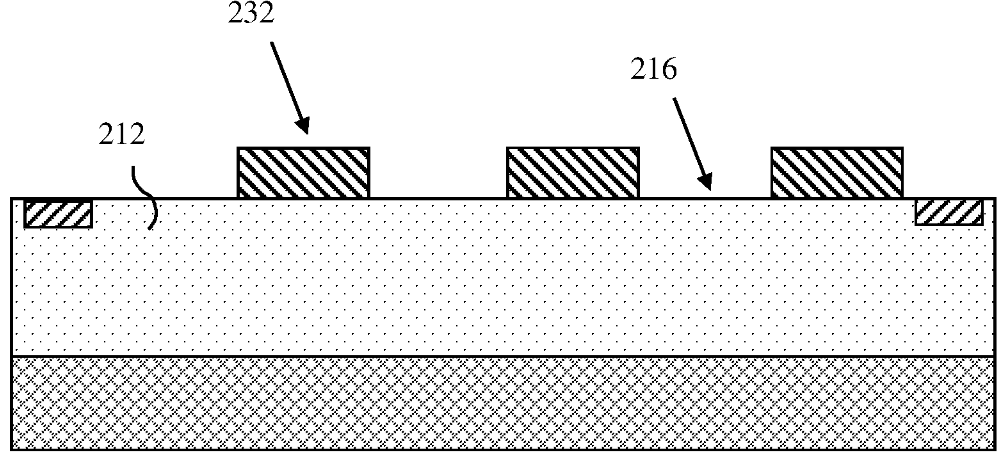

In block 108, referring now to FIG. 2D, a photoresist pattern 232 is formed on the first side 216 of the epitaxial layer 212. Though FIGS. 2D-2M show the process to fabricate three devices, the number of devices in a cross-sectional plane may vary. Block 108 may be followed by block 110.

Figure 2E:
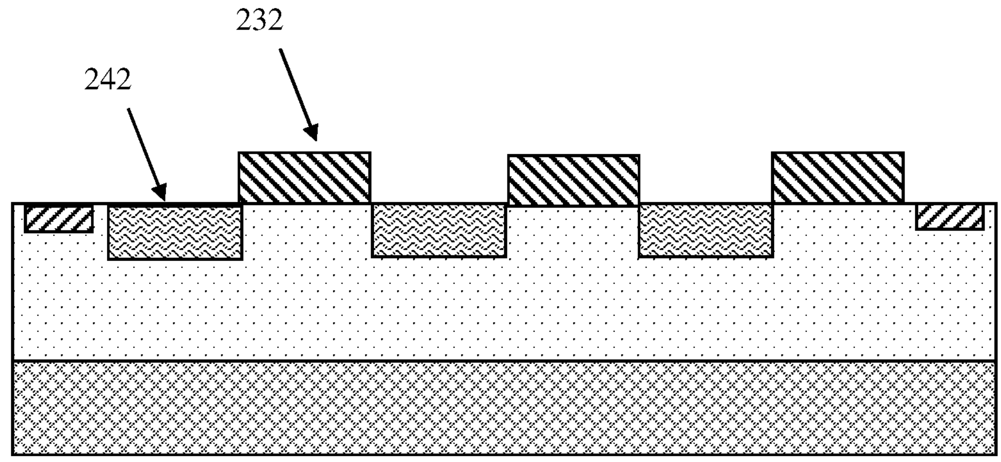

In block 110, referring now to FIG. 2E, a plurality of super junction buffer regions 242 are formed on the first side 216 of the epitaxial layer 212. In one example, the super junction buffer regions 242 are doped with N type. Block 110 may be followed by block 112.

Figure 2F:
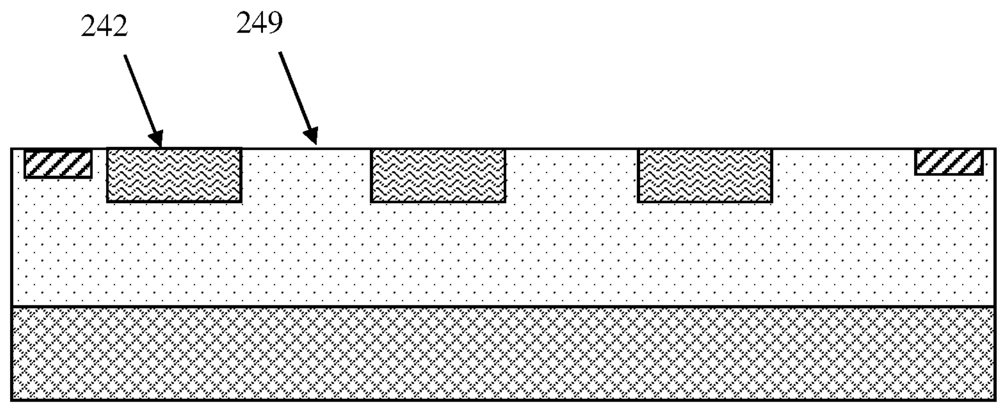

In block 112, referring now to FIG. 2F, the photoresist pattern 232 of FIG. 2E is removed so as to expose the surface 249 of the first side 216 of the epitaxial layer 212. Block 112 may be followed by block 114.

Figure 2G:
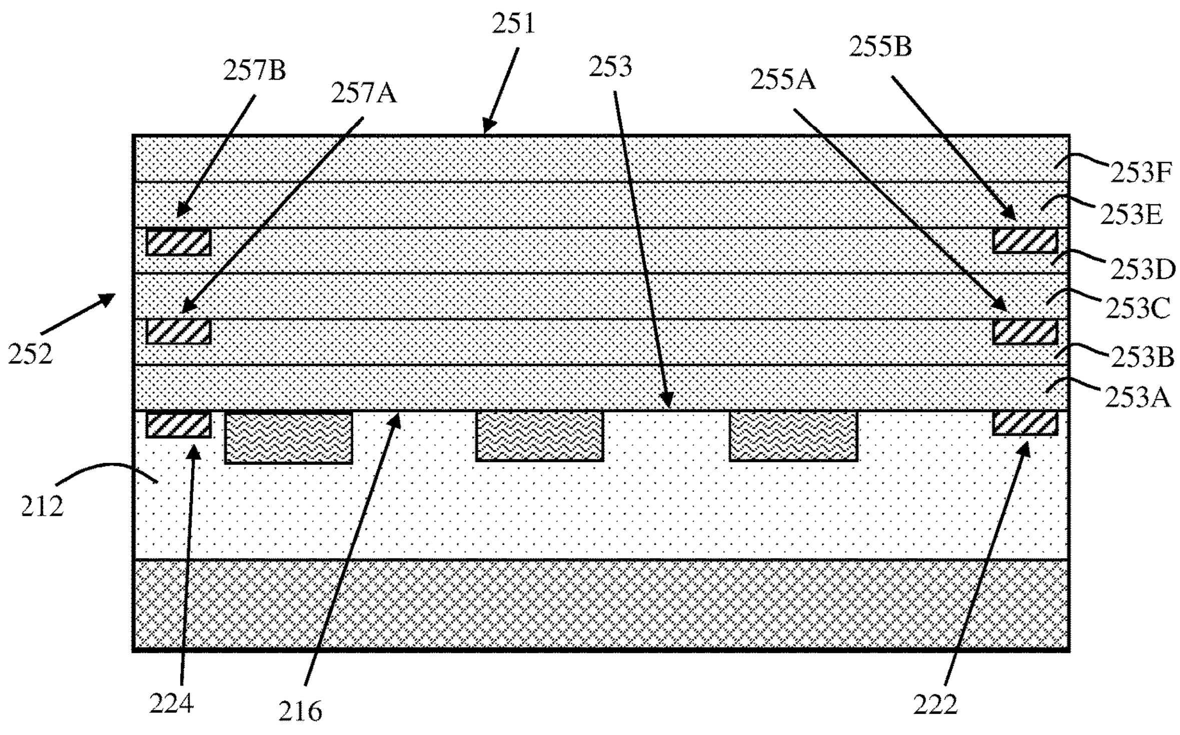

In block 114, referring now to FIG. 2G, additional two or more epitaxial layers 252 are formed on top of the epitaxial layer 212. The additional two or more epitaxial layers 252 comprises a first side 251 and a second side 253 opposite the first side 251. The second side 253 of the additional two or more epitaxial layers 252 is attached to the first side 216 of the epitaxial layer 212. In one example, a thickness of each layer of the additional two or more epitaxial layers 252 is 6 microns. Though six epitaxial layers (253A, 253B, 253C, 253D, 253E, and 253F) are shown in FIG. 2G, the number of epitaxial layers may vary. P and/or N type dopants are implanted into each epitaxial layer to form doped P columns 421 and doped N columns 423 shown in FIG. 4 in each device area.

In examples of the present disclosure, the number of epitaxial layers is an even number. In examples of the present disclosure, intermediate alignment marks are formed every two epitaxial layers. In one example, the additional two or more epitaxial layers 252 consists of two additional epitaxial layers. There are no intermediate alignment marks. In another example, the additional two or more epitaxial layers 252 consists of four additional epitaxial layers. There are two intermediate alignment marks. In still another example, the additional two or more epitaxial layers 252 consists of six additional epitaxial layers including a first additional epitaxial layer 253A, a second additional epitaxial layer 253B, a third additional epitaxial layer 253C, a fourth additional epitaxial layer 253D, a fifth additional epitaxial layer 253E, and a sixth additional epitaxial layer 253F. There are four intermediate alignment marks including a first lower intermediate alignment mark 255A, a second lower intermediate alignment mark 257A, a first higher intermediate alignment mark 255B, and a second higher intermediate alignment mark 257B.

The first lower intermediate alignment mark 255A is formed between the second additional epitaxial layer 253B and the third additional epitaxial layer 253C. The second lower intermediate alignment mark 257A is formed between the second additional epitaxial layer 253B and the third additional epitaxial layer 253C. The first higher intermediate alignment mark 255B is formed between the fourth additional epitaxial layer 253D and the fifth additional epitaxial layer 253E. The second higher intermediate alignment mark 257B is formed between the fourth additional epitaxial layer 253D and the fifth additional epitaxial layer 253E.

Figure 2H:
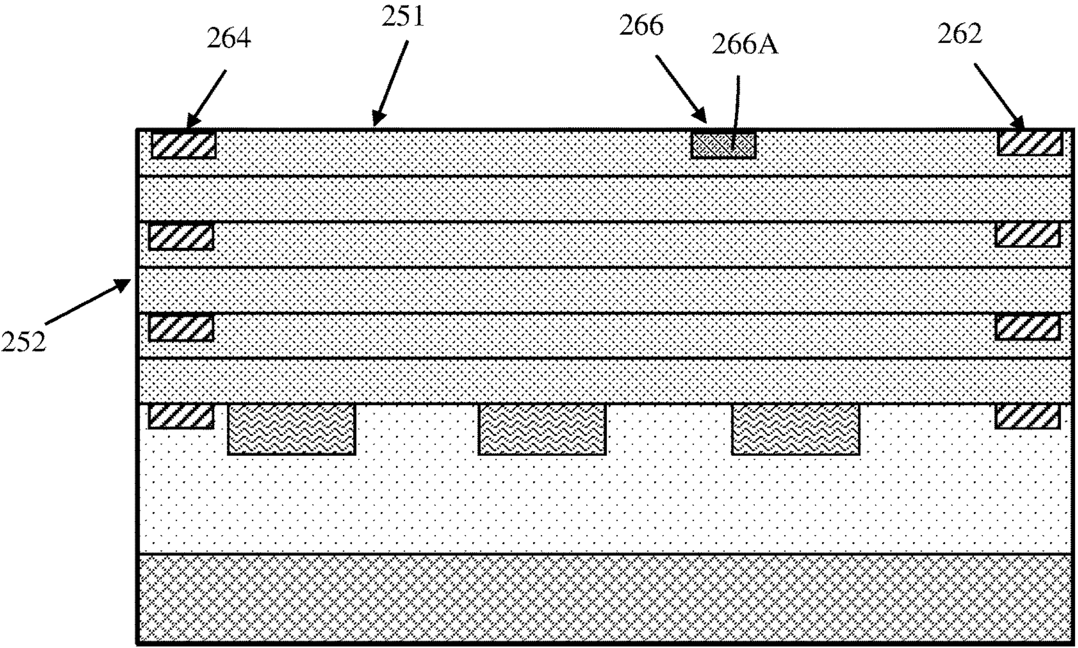

In block 116, referring now to FIGS. 2H and 3A, a first refreshed alignment mark 262, a second refreshed alignment mark 264, and additional one or more alignment marks 266 are formed on the first side 251 of the additional two or more epitaxial layers 252. In one example, a distance between a center 351 of FIG. 3A of the wafer and a first one 266A of the additional one or more alignment marks 266 is in a range from 20% to 70% of a radius of the wafer. In another example, a distance between a center 351 of FIG. 3A of the wafer and the first alignment mark 222 is larger than 90% of the radius of the wafer.

Figure 3B:
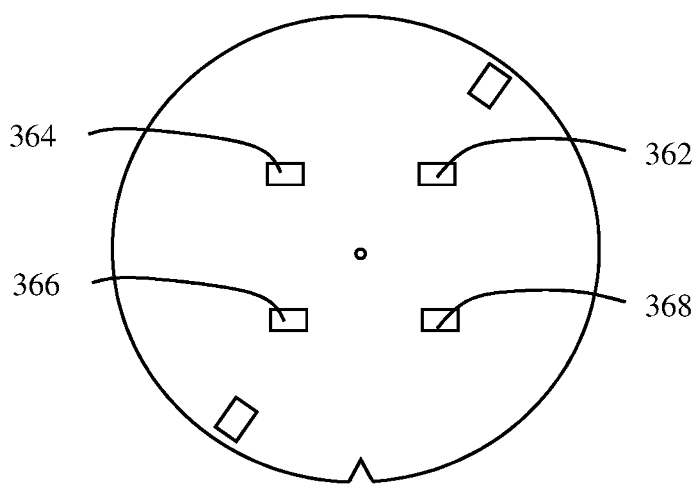

In one example, referring now to FIGS. 2H and 3A, the additional one or more alignment marks 266 comprise a single alignment mark. In one example, referring now to FIGS. 2H and 3B, the additional one or more alignment marks 266 comprise four alignment marks 362, 364, 366, and 368. Each of the four alignment marks 362, 364, 366, and 368 is positioned at a respective vertex of a square shape. In examples of the present disclosure, for a 6-inch (152.4 mm) diameter wafer or a 8-inch (203.2 mm) diameter wafer, the coordinates of the four alignment marks 362, 364, 366, and 368 are (44.5 mm, 48.3 mm), (−44.5 mm, 48.3 mm), (−44.5 mm, −48.3 mm), and (44.5 mm, −48.3 mm) respectively (origin of the coordinate is at the center of the top surface of the wafer). In examples of the present disclosure, a length of the side of the square shape is 65.67 mm. Block 116 may be followed by block 118.

Figure 2I:
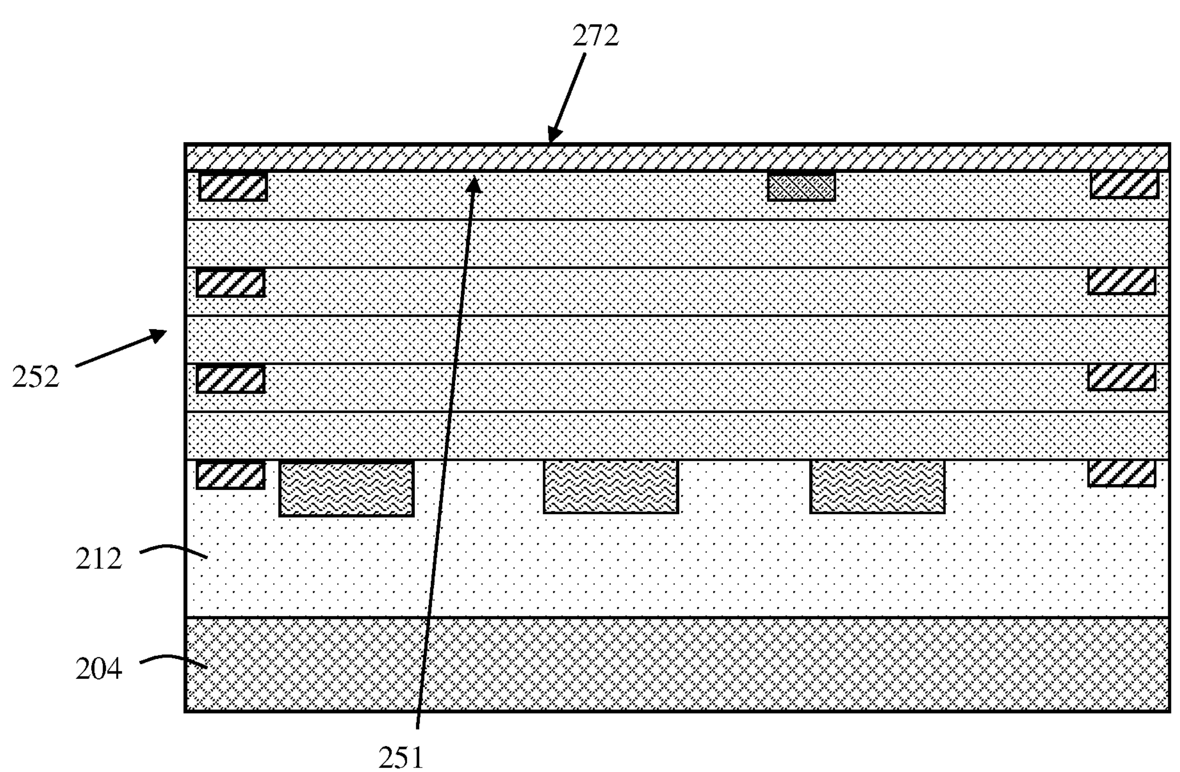
Figure 4:
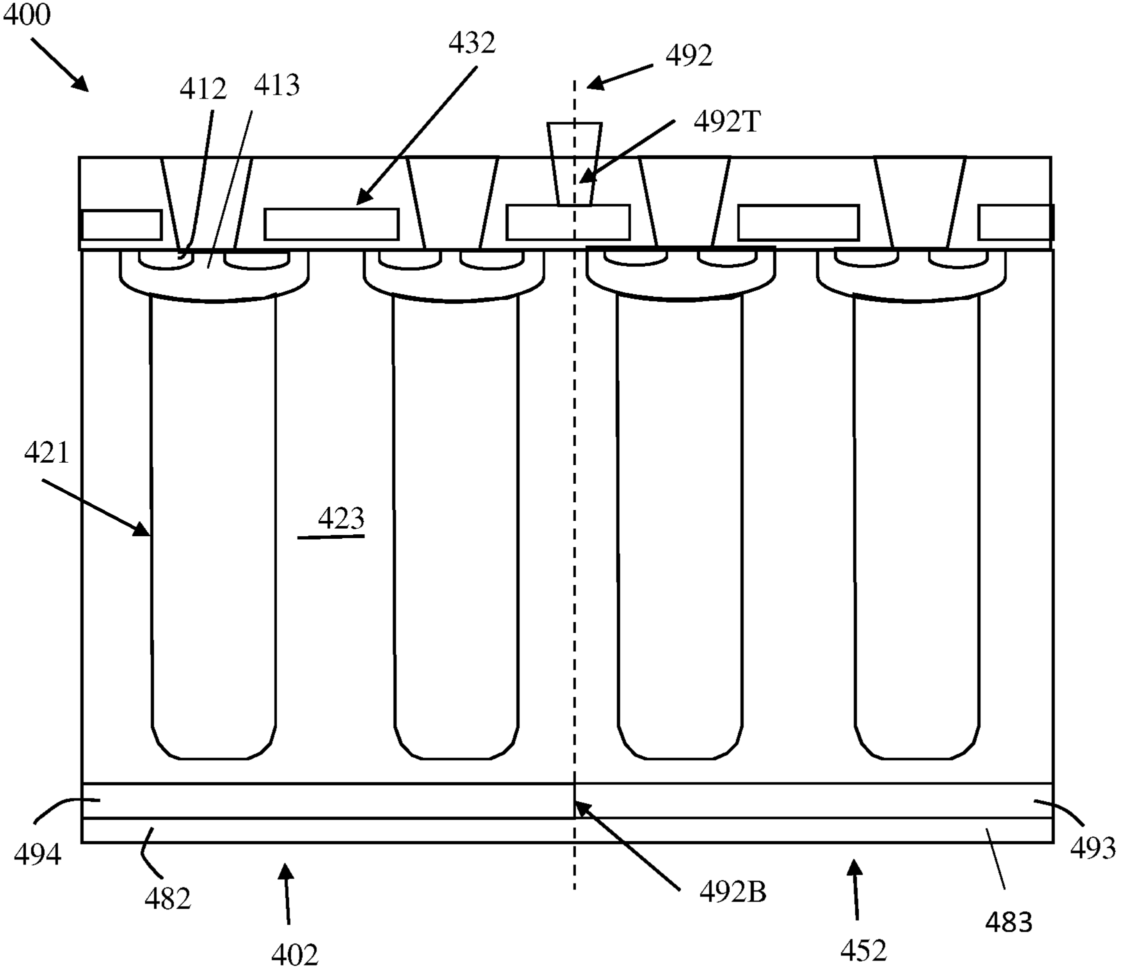
FIG. 4 shows a semiconductor device in examples of the present disclosure.

In block 118, referring now to FIGS. 2I and 4, a top layer 272 is formed on the first side 251 of the additional two or more epitaxial layers 252. A SJ-MOSFET and an RC-IGBT top structures are formed in each device area of the top layer 272 using the refreshed alignment marks 262, 264 and the additional one or more alignment marks 266 as reference. The top layer 272 comprises a plurality of source/emitter and body regions (for example, a plurality of source/emitter regions 412 and body regions 413 of semiconductor device 400 of FIG. 4) and a plurality of gate regions (for example, a gate region 432 of semiconductor device 400 of FIG. 4). A top metal layer may be deposited over the top layer 272 to form the device top electrodes. Block 118 may be followed by block 120.

Figure 2J:
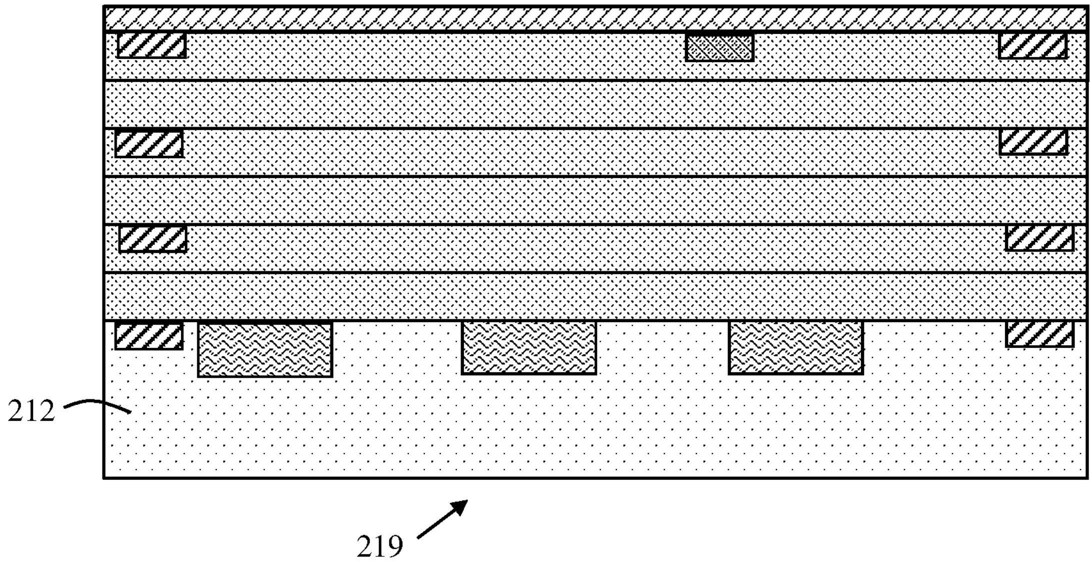

In block 120, referring now to FIG. 2J, the substrate layer of FIG. 21 is removed so as to expose the surface 219 of epitaxial layer 212. Block 120 may be followed by block 122.

Figure 2K:
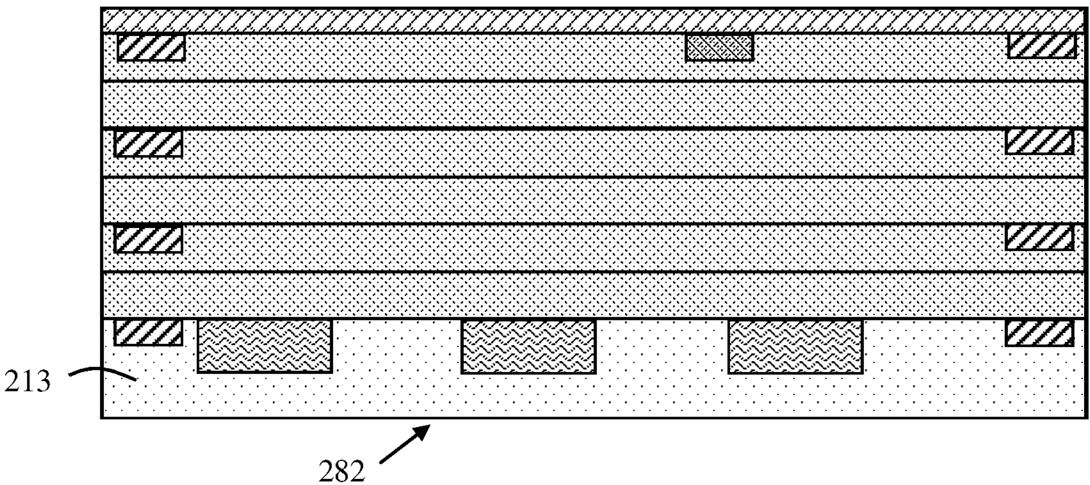

In block 122, referring now to FIG. 2K, a grinding process is applied to the surface 219 at the second side 218 of the epitaxial layer 212 so as to form a thinned epitaxial layer 213 comprising an exposed surface 282. Block 122 may be followed by block 124.

Figure 2L:
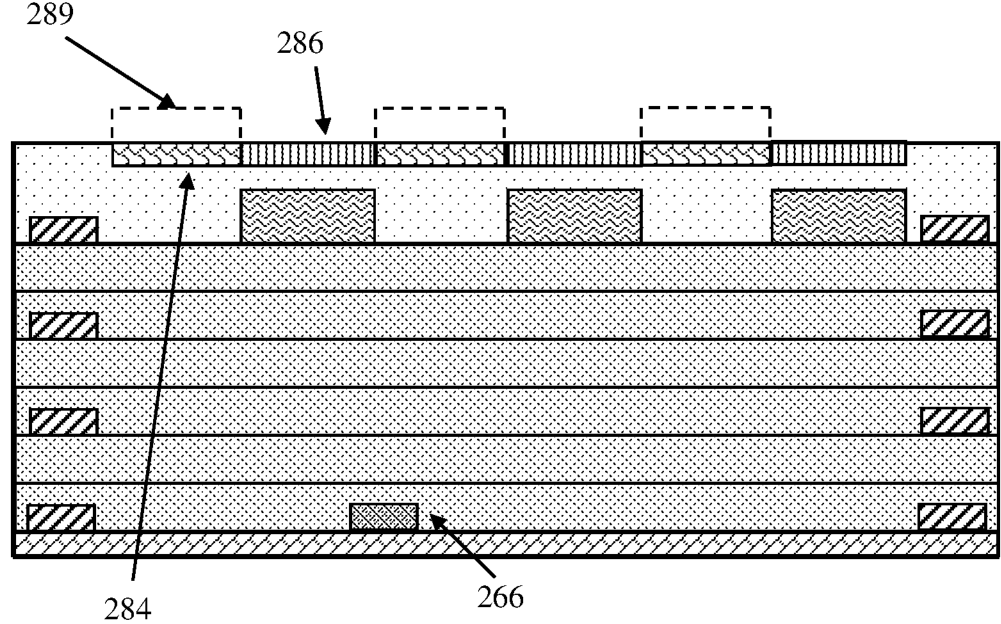

In block 124, referring now to FIG. 2L, the wafer is flipped so that the thinned epitaxial layer 213 is on top for processing. A first plurality of regions 284 and a second plurality of regions 286 are formed on the exposed surface 282 of the thinned epitaxial layer 213 by referencing the additional one or more alignment marks 266. In one example, the first plurality of regions 284 and the second plurality of regions 286 are doped with opposite conductivities. Back metal layer may be deposited onto the exposed surface 282 to form the bottom electrode of the device.

Figure 5:
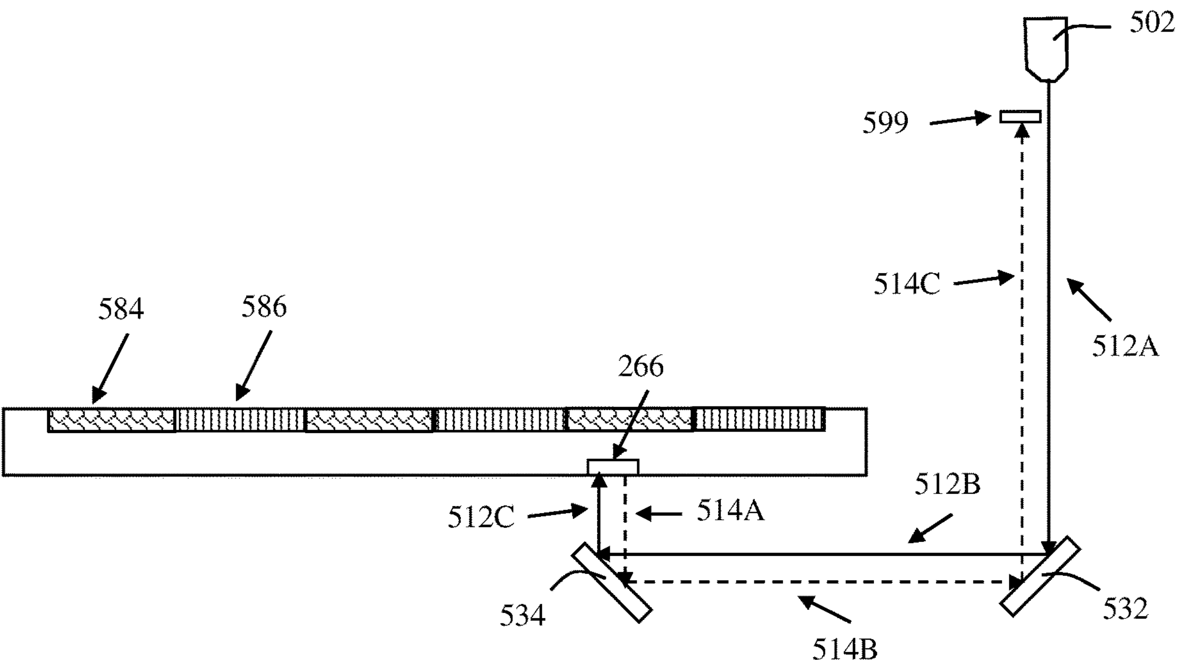
FIG. 5 shows light beams capturing images of one or more alignment marks in examples of the present disclosure.

FIG. 5 shows light beams capturing images of one or more alignment marks in examples of the present disclosure. In one example, the tool 502 is an ASML 3DALIGN™ product described in paragraph of US Patent Application Publication US2019/0006285 to Zhang et al. The tool 502 emits light beam 512A. Light beam 512A is reflected by mirror 532 becoming light beam 512B. Light beam 512B is reflected by mirror 534 becoming light beam 512C. The returning light beam is shown in dashed lines. Light beam 514A is reflected by mirror 534 becoming light beam 514B. Light beam 514B is reflected by mirror 532 becoming light beam 514C. An image of the additional one or more alignment marks 266 is captured on a focal plane 599. The first plurality of regions 584 and the second plurality of regions 586 are aligned using the image. Therefore, referring now to FIG. 4, a respective misalignment between a top portion 492T and a bottom portion 492B of an interface 492 between the respective SJ-MOSFET 402 and the respective RC-IGBT 452 is less than 0.5 micron (reduced from 30 microns).

In examples of the present disclosure, block 124 comprises the sub-steps of forming the first plurality of regions 284 being a plurality of doped second conductivity type regions; forming an additional photoresist pattern 289 (shown in dashed-lines because of being removed in a later sub-step); forming the second plurality of regions 286 being a plurality of heavily doped first conductivity type regions; and removing the additional photoresist pattern 289. In examples of the present disclosure, the plurality of doped second conductivity type regions are a plurality of doped P type regions. The plurality of heavily doped first conductivity type regions are a plurality of heavily doped N type regions. Paragraph of US patent Application Publication No. US2019/0148165 to He et al. recites that "In examples of the present disclosure, heavily doped has ion concentration in a range above $10^{18}$ $cm^{-3}$. Doped has ion concentration in a range from $10^{16}$ to $10^{18}$ $cm^{-3}$. Lightly doped has ion concentration in a range below $10^{16}$ $cm^{-3}$."Block 124 may be followed by block 126.

Figure 2M:
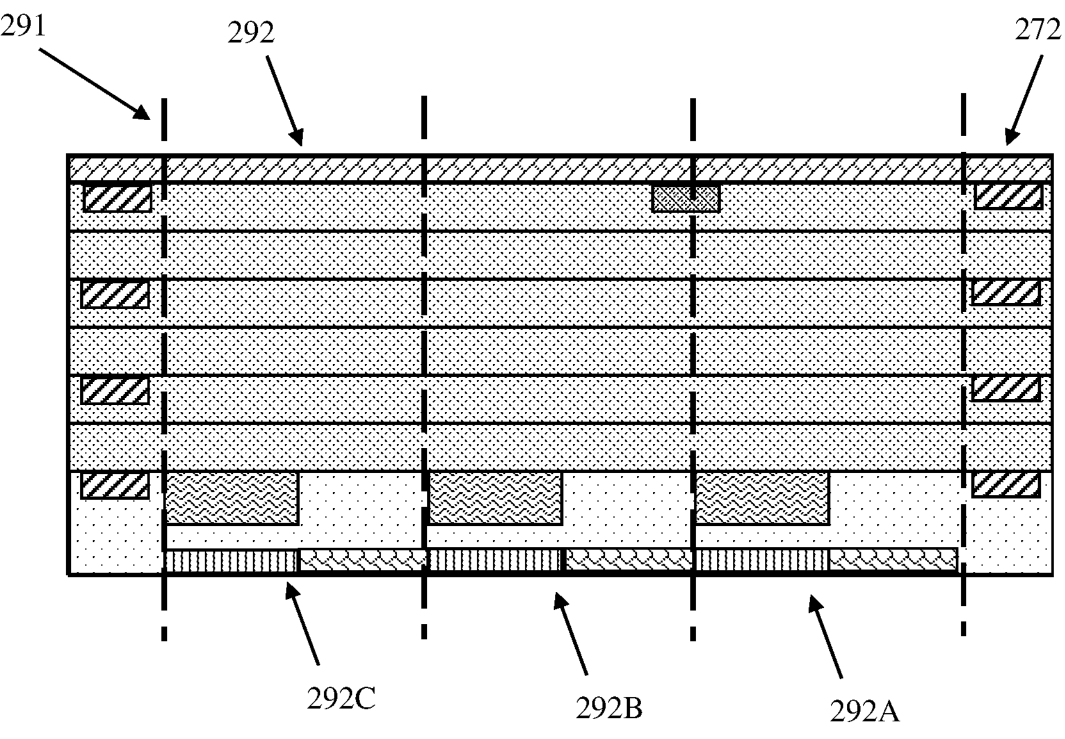

In block 126, referring now to FIG. 2M, the wafer is flipped again so that the top layer 272 is on top. A singulation process, comprising a plurality of cutting lines 291, is applied so as to form the plurality of semiconductor devices 292. Though only three semiconductor devices 292A, 292B, and 292C are shown in FIG. 2M, the number of semiconductor devices fabricated from a wafer may vary.

FIG. 4 illustrates an example for a semiconductor device 400 fabricated by the method 100. The semiconductor device 400 comprises a SJ-MOSFET 402 area and an RC-IGBT 452 area. The SJ-MOSFET 402 and the RC-IGBT 452 each comprise a plurality of source/emitter regions 412, a plurality of body regions 413, and a plurality of gate regions 432 on the top portion of the device. A plurality of P columns 421 and an N columns 423 form a super junction structure in the middle portion of the device. The SJ-MOSFET 402 area further comprise a drain region 482 under a second buffer region 494 and the RC-IGBT 452 area further comprises a collector region 483 under a first buffer region 493. The second buffer region 494 may be the super junction buffer regions 242 shown in FIG. 2F and the first buffer region 493 may be the epitaxial layer 212. The drain region 482 of the SJ-MOSFET and the collector region 483 of the RC-IGBT have opposite conductivities. Metal layers on the top and bottom surfaces of the device 400 are not shown.

Those of ordinary skill in the art may recognize that modifications of the embodiments disclosed herein are possible. For example, a number of layers of the additional two or more epitaxial layers may vary. Other modifications may occur to those of ordinary skill in this art, and all such modifications are deemed to fall within the purview of the present invention, as defined by the claims.

The invention claimed is:

1. A method for fabricating a plurality of semiconductor devices, the method comprising the steps of:

providing a semiconductor wafer comprising:

a substrate layer being a doped first conductivity type silicon substrate layer, the substrate layer comprising a first side and a second side opposite the first side;

forming an epitaxial layer on the first side of the substrate layer, the epitaxial layer comprising a first side and a second side opposite the first side, the second side of the epitaxial layer being attached to the first side of the substrate layer;

forming a first alignment mark and a second alignment mark on the first side of the epitaxial layer;

forming a photoresist pattern on the first side of the epitaxial layer;

forming a plurality of super junction buffer regions on the first side of the epitaxial layer;

removing the photoresist pattern;

forming additional two or more epitaxial layers, the additional two or more epitaxial layers comprising a first side and a second side opposite the first side, the second side of the additional two or more epitaxial layers being attached to the first side of the epitaxial layer;

forming a first refreshed alignment mark, a second refreshed alignment mark, and additional one or more alignment marks on the first side of the additional two or more epitaxial layers, a distance between a center of the wafer and a first one of the additional one or more alignment marks is in a range from twenty percent to seventy percent of a radius of the wafer;

forming a top layer;

removing the substrate layer;

applying a grinding process to the second side of the epitaxial layer forming a thinned epitaxial layer comprising an exposed surface;

forming a first plurality of regions and a second plurality of regions on the exposed surface of the thinned epitaxial layer by referencing the additional one or more alignment marks; and applying a singulation process forming the plurality of semiconductor devices.

2. The method of claim 1, wherein the additional one or more alignment marks comprise a single alignment mark.

3. The method of claim 1, wherein the additional one or more alignment marks comprise four alignment marks; and wherein each of the four alignment marks is positioned at a respective vertex of a square shape.

4. The method of claim 1, wherein the step of forming the first plurality of regions and the second plurality of regions comprises the sub-steps of:

forming the first plurality of regions being a plurality of doped second conductivity type regions;

forming an additional photoresist pattern;

forming the second plurality of regions being a plurality of heavily doped first conductivity type regions; and removing the additional photoresist pattern.

5. The method of claim 4, wherein the doped first conductivity type silicon substrate layer is a doped N type silicon substrate layer;

wherein the plurality of doped second conductivity type regions are a plurality of doped P type regions; and wherein the plurality of heavily doped first conductivity type regions are a plurality of heavily doped N type regions.

6. The method of claim 5, wherein the top layer comprises:

a plurality of source regions; and a plurality of gate regions.

7. The method of claim 1, wherein each device of the plurality of semiconductor devices comprises:

a respective super junction metal-oxide-semiconductor field-effect transistor (SJ-MOSFET); and a respective reverse conducting insulated-gate bipolar transistor (RC-IGBT).

8. The method of claim 7, wherein a respective misalignment between a top portion and a bottom portion of an interface between the respective SJ-MOSFET and the respective RC-IGBT is less than one-half of a micron.

9. The method of claim 1, the step of forming the first plurality of regions and the second plurality of regions on the exposed surface of the thinned epitaxial layer by referencing the additional one or more alignment marks comprising the sub-steps of capturing an image of the additional one or more alignment marks on a focal plane; and aligning the first plurality of regions and the second plurality of regions using the image.

10. The method of claim 1, wherein the additional two or more epitaxial layers consists of:

a first additional epitaxial layer; and a second additional epitaxial layer.

11. The method of claim 1, wherein the additional two or more epitaxial layers consists of:

a first additional epitaxial layer;

a second additional epitaxial layer;

a third additional epitaxial layer; and a fourth additional epitaxial layer;

wherein during the step of forming the additional two or more epitaxial layers, a first intermediate alignment mark is formed between the second additional epitaxial layer and the third additional epitaxial layer; and a second intermediate alignment mark is formed between the second additional epitaxial layer and the third additional epitaxial layer.

12. The method of claim 1, wherein the additional two or more epitaxial layers consists of:

a first additional epitaxial layer;

a second additional epitaxial layer;

a third additional epitaxial layer;

a fourth additional epitaxial layer;

a fifth additional epitaxial layer; and a sixth additional epitaxial layer;

wherein during the step of forming the additional two or more epitaxial layers, a first lower intermediate alignment mark is formed between the second additional epitaxial layer and the third additional epitaxial layer;

a second lower intermediate alignment mark is formed between the second additional epitaxial layer and the third additional epitaxial layer;

a first higher intermediate alignment mark is formed between the fourth additional epitaxial layer and the fifth additional epitaxial layer; and a second higher intermediate alignment mark is formed between the fourth additional epitaxial layer and the fifth additional epitaxial layer.

* * * * *